(12) United States Patent
Like

(10) Patent No.: US 12,707,572 B2
(45) Date of Patent: Aug. 11, 2026

(54) ELECTRIC JUNCTION BOX ASSEMBLY WITH REMOVABLE COVER

(71) Applicant: Sumitomo Wiring Systems, Ltd., Yokkaichi (JP)

(72) Inventor: Nathan Like, Farmington Hills, MI (US)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 427 days.

(21) Appl. No.: 18/390,947

(22) Filed: Dec. 20, 2023

(65) Prior Publication Data

US 2025/0212341 A1 Jun. 26, 2025

(51) Int. Cl.

*H05K 5/00* (2025.01)
*B60R 16/023* (2006.01)

(52) U.S. Cl.

CPC ....... *H05K 5/0069* (2013.01); *B60R 16/0238* (2013.01); *H05K 5/0052* (2013.01)

(58) Field of Classification Search

CPC .... H05K 5/0069; H05K 5/0052; H05K 1/189; B60R 16/0238

USPC .......................................................... 174/59

See application file for complete search history.

(56) References Cited

FOREIGN PATENT DOCUMENTS

| | | | |
|---|---|---|---|
| CN | 105633909 | A | 6/2016 |
| CN | 105984405 | A | 10/2016 |
| CN | 110077236 | A | 8/2019 |
| KR | 101534079 | B1 | 7/2015 |
| KR | 101550317 | B1 | 9/2015 |
| KR | 102238051 | B1 | 4/2021 |
| KR | 102460150 | B1 | 10/2022 |
| KR | 102485376 | B1 | 1/2023 |

*Primary Examiner* — Timothy J Thompson
*Assistant Examiner* — Sidi M Maiga
(74) *Attorney, Agent, or Firm* — Brooks Kushman P.C.

(57) ABSTRACT

An electric junction box assembly includes an outer case and a top cover including an electrically conductive patch mounted to the outer case. An inner case is disposed in the outer case and includes an upper cover having a pair of slits spaced apart from each other and disposed beneath the electrically conductive patch. A first terminal and a second terminal are disposed in the inner case and spaced part from each other. Both of the first terminal and the second terminal have a projection portion extending into the pair of slits and contacting the electrically conductive path so as to complete an electric connection, wherein the electric connection is disconnected by removing the top cover.

13 Claims, 5 Drawing Sheets

ELECTRIC JUNCTION BOX ASSEMBLY WITH REMOVABLE COVER

TECHNICAL FIELD

The present specification generally relates to an electric junction box assembly and more particularly to an electric junction box assembly having a removable cover for disconnecting power.

BACKGROUND

In general, an electric junction box assembly is used in a platform, such as an automotive vehicle, to distribute power throughout the vehicle. An illustrative view of a conventional electric junction box assembly 500 is shown in FIG. 1. The electric junction box assembly 500 includes a housing 502 enclosed by a top cover 504. The housing 502 holds electric components (not shown) which are configured to distribute power from a power source (not shown), such as a battery to electric devices (not shown) throughout the vehicle.

The electric box assembly 500 is configured to distribute power from the battery to the electric devices. The electric junction box assembly 500 includes power terminals 506*a*, 506*b*. In particular, a first power terminal 506*a* is connected to one end of a wire and the other end of the wire is coupled to the battery. A second power terminal 506*b* is connected to one end of a wire harness and the other end of the wire harness is connected to the electric devices throughout the vehicle. Thus, the electric junction box assembly 500 supplies power from the battery to electric devices throughout the vehicle. The electric junction box assembly 500 houses various components such as fuses and relays to regulate power to the various electric devices.

With reference now to FIG. 2, the electric junction box assembly 500 includes a pair of terminals 508*a*, 508*b*. A first terminal 508*a* is connected to a wire that is electrically connected to a battery vis-a-vis power terminal 506*a*. A second terminal 508*b* is connected to a wire that is electrically connected to the second power terminal 506*b* so as to supply power to the electric devices throughout the vehicle. An electric circuit (not shown) connects the first terminal 508*a* to the second terminal 508*b*. The electric circuit may include fuses and switches to disconnect power.

The electric junction box assembly 500 is mounted in the vehicle and competes with other devices for packaging space. As such, maintenance of the electric junction box assembly 500 may be difficult as access to the power terminals 506*a*, 506*b* may be difficult. However, it is desirable to make sure that the power is disconnected before maintenance is performed. To ensure that the power is disconnected, the wires may be disconnected from the power terminals 506*a*, 506*b*. However, removing the wires may be time consuming in instances where the power terminals are not easily accessible due to packaging constraints. Further, in almost every case, the top cover 504 must be removed in order to perform maintenance.

Accordingly, it remains desirable to have an electric junction box assembly configured to disconnect from power by simply removing the top cover.

SUMMARY

In one aspect, an electric junction box assembly is configured to distribute power from a battery to a plurality of electric devices. The electric junction box assembly includes an outer case having an open top and a top cover configured to close the open top. The top cover includes an electrically conductive patch. The electric junction box assembly further includes an inner case disposed in the outer case. The inner case includes an open top and an upper cover configured to close the open top. The upper cover includes a pair of slits spaced apart from each other. The pair of slits is disposed beneath the electrically conductive patch. A first terminal and a second terminal are disposed in the inner case and spaced part from each other. Both of the first terminal and the second terminal have a projection portion extending into a corresponding one of the pair of slits and contacting the electrically conductive path so as to complete an electric connection. The electric connection is disconnected by removing the top cover.

In one aspect, the electric junction box further includes a first tower spaced apart from a second tower. The first tower and the second tower are disposed in the inner case and the first terminal is mounted on the first tower and the second terminal is mounted on the second tower. The first tower and the second tower may be the same height.

In one aspect, the electrically conductive patch is centered on the top cover.

In one aspect, the top cover includes a main body portion bounding the electrically conductive patch. In such an aspect, the main body portion may be formed of an electrically insulating material and the electrically conductive path may be elevated relative to the main body portion. The main body portion may have a planar surface.

In one aspect, the first terminal and the second terminal further includes a body portion and a clamp portion. The body portion is interposed between the projection portion and the clamp portion. The clamp portion may include a plurality of fingers configured to clamp onto a wire. The body portion may include an aperture for attachment to the one of the first tower and the second tower. In such an aspect, both the first tower and the second tower may include a threaded bore and a pair of fasteners fix the first terminal and the second terminal to the pair of towers. For instance, the fasteners may include a threaded shaft and a head portion.

In one aspect, the projection portion of the first terminal and the projection portion of the second terminal may be pointed towards each other. Alternatively, the projection portion of the first terminal and the projection portion of the second terminal may be pointed away from each other.

According to one aspect, the electric junction box assembly includes a top cover having an electric and an inner case having a biasing member formed of an electrically conductive material and an upper cover including a resilient prong, wherein the top cover is configured to press the resilient prong against the second end of the biasing member to place the first terminal in electric contact with the second terminal when the top cover is mounted onto the outer case and allow the resilient prong to be free of the second end of the biasing member when the top cover is removed so as to allow the second end of the biasing member to be spaced apart from the other of the first terminal and the second terminal and disconnect power. Accordingly, the electric junction box disclosed herein allows power to be disconnected by simply removing the top cover so as to allow for maintenance to be performed.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

DETAILED DESCRIPTION OF PREFERRED EMBODIMENTS

Example configurations will now be described more fully with reference to the accompanying drawings. Example configurations are provided so that this disclosure will be thorough, and will fully convey the scope of the disclosure to those of ordinary skill in the art. Specific details are set forth such as examples of specific components, devices, and methods, to provide a thorough understanding of configurations of the present disclosure. It will be apparent to those of ordinary skill in the art that specific details need not be employed, that example configurations may be embodied in many different forms, and that the specific details and the example configurations should not be construed to limit the scope of the disclosure.

The terminology used herein is for the purpose of describing particular exemplary configurations only and is not intended to be limiting. As used herein, the singular articles "a," "an," and "the" may be intended to include the plural forms as well, unless the context clearly indicates otherwise. The terms "comprises," "comprising," "including," and "having," are inclusive and therefore specify the presence of features, steps, operations, elements, and/or components, but do not preclude the presence or addition of one or more other features, steps, operations, elements, components, and/or groups thereof. The method steps, processes, and operations described herein are not to be construed as necessarily requiring their performance in the particular order discussed or illustrated, unless specifically identified as an order of performance. Additional or alternative steps may be employed.

When an element or layer is referred to as being "on," "engaged to," "connected to," "attached to," or "coupled to" another element or layer, it may be directly on, engaged, connected, attached, or coupled to the other element or layer, or intervening elements or layers may be present. In contrast, when an element is referred to as being "directly on," "directly engaged to," "directly connected to," "directly attached to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Referring generally to the figures, embodiments of the present disclosure include an electric junction box assembly having a top cover removably attached to an outer case wherein the top cover is configured to disconnect power within the electric junction box. Accordingly, the electric junction box disclosed herein allows power to be disconnected by simply removing the top cover so as to allow for maintenance to be performed.

Figure 1:
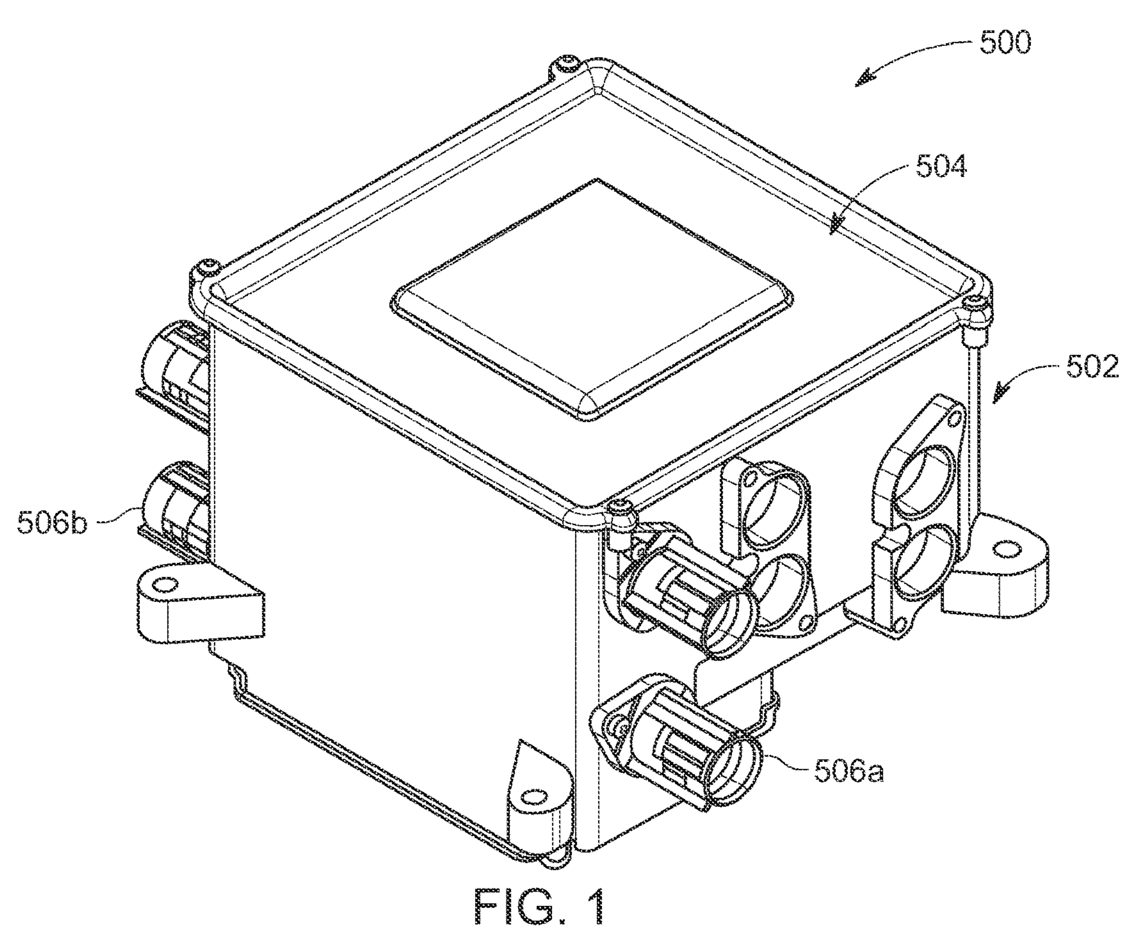
FIG. 1 is a view of a conventional electric junction box assembly.
Figure 2:
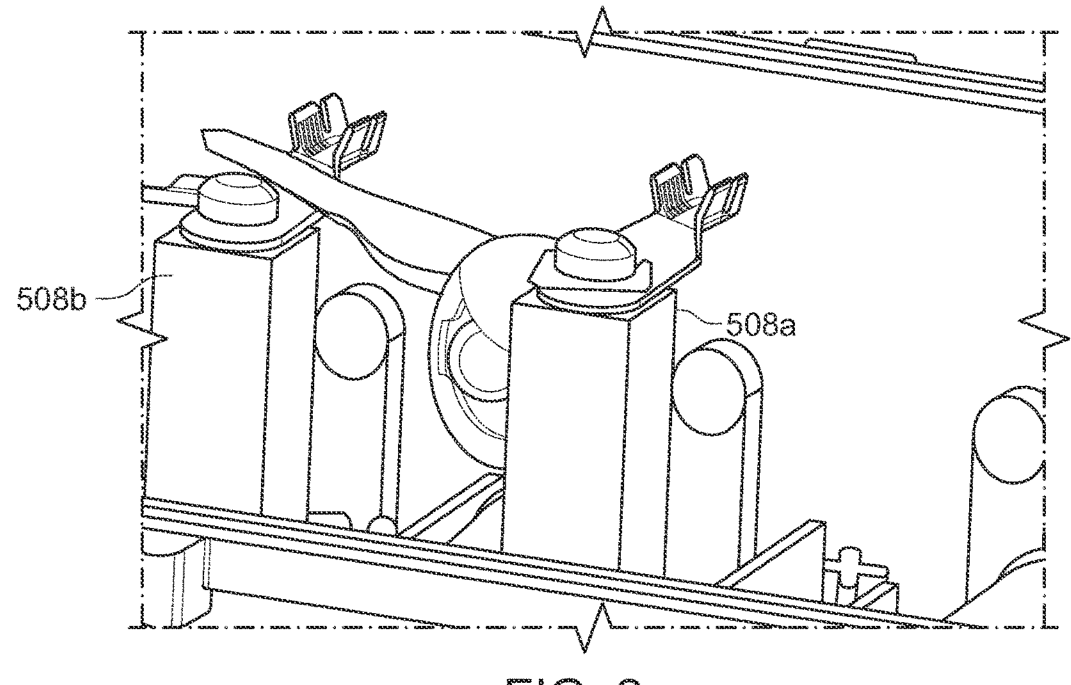
FIG. 2 is a view of the electric junction box assembly shown in FIG. 1 with the top cover removed.
Figure 3:
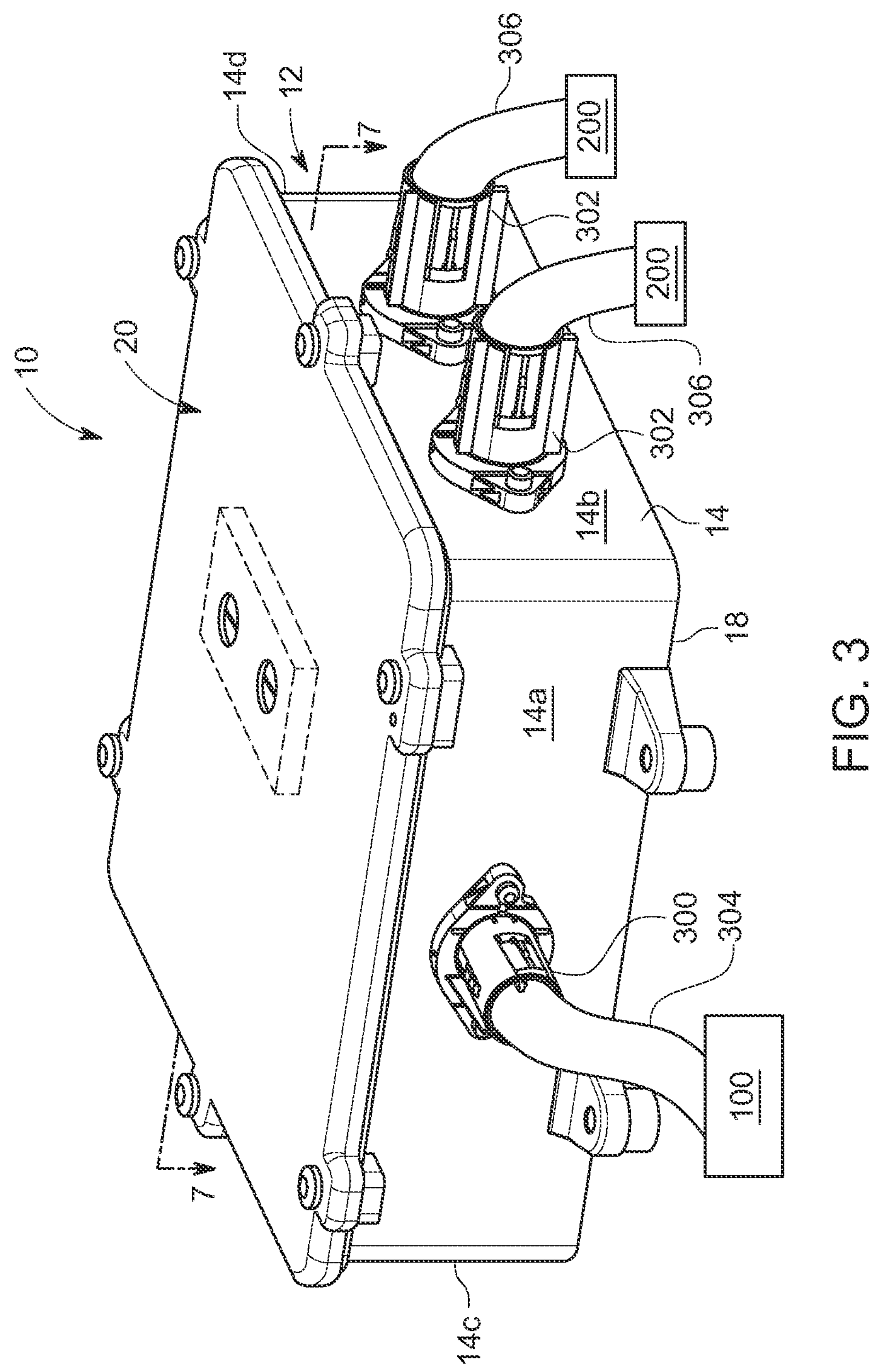
FIG. 3 is an exemplary depiction of an electric junction box assembly according to one or more embodiments illustrated herein.

With reference first to FIG. 3, a perspective view of an illustrative embodiment of an electric junction box assembly 10 is provided. The electric junction box assembly 10 is configured to house a plurality of electric components (not shown). Such electric components illustratively include a relay switch, fuses and the like.

The electric components are configured to direct power from a power source such as a battery 100 to various electric devices 200 such as actuators, motors and devices. For illustrative purposes, the electric junction box assembly 10 disclosed herein is described within the context of an automotive vehicle (not shown). However, it should be appreciated that the electric junction box assembly 10 is described herein in the context of an automotive vehicle for illustrative purposes but may be used in other applications. Accordingly, a description of the electric junction box assembly 10 within the context of an automotive vehicle is not limiting to the scope of the appended claims.

With reference again to FIG. 3, the electric junction box assembly 10 includes an outer case 12 having an outer wall 14 bounding a storage space and having a generally cuboidal dimension so as to define container with an open top 16 opposite a closed bottom 18. The outer wall 14 may be defined as having a front portion 14*a*, a pair of side portions 14*b*, 14*c* and a back portion 14*d*. The outer wall 14 is a generally planar member which may be formed of a resilient and durable material suitable for injection molding, illustratively including polypropylene, Acrylonitrile butadiene styrene, polyoxymethylene, polycarbonate and the like.

The outer case 12 may further include a top cover 20 configured to close the open top 16. In one aspect, the outer case 12 may have an open bottom, in which case the outer case further includes a bottom cover 22 to close the open bottom. The front portion 14*a* and the side portion 14*b* may include a first power terminal 300 and a second power terminal 302. The first power terminal 300 is configured to engage a first wire 304 connected to a battery 100. The second power terminal 302 is configured to engage a second wire 306 for supplying power to various electric devices 200 external to the electric junction box assembly 10. Thus, when the first wire 304 is coupled to both the battery 100 and the first power terminal 300, power is supplied to the electric devices through the second wire 306 attached to the second power terminal 302.

The top cover 20 may be attached to the outer case 12 using conventional fastening means such as a bolt, a screw or a clips. The top cover 20 includes an electrically conductive patch 24 disposed on an inner surface of the top cover 20, as indicated by the dashed lines. The electrically conductive patch 24 is formed of an electrically conductive material such as steel. In one aspect, the electrically conductive patch 24 is a sheet of steel that may be formed from a stamping process. The electrically conductive patch 24 may have a top surface opposite a bottom surface, wherein the top and the bottom surfaces 24*a*, 24*b* are exposed. Alternatively, the top surface may be covered by an electrically insulating material, such as rubber or an injection molding material such as polypropylene, Acrylonitrile butadiene styrene, polyoxymethylene, polycarbonate and the like. In such an aspect, the electrically conductive patch is embedded within the top cover with the bottom surface being exposed.

Figure 4:
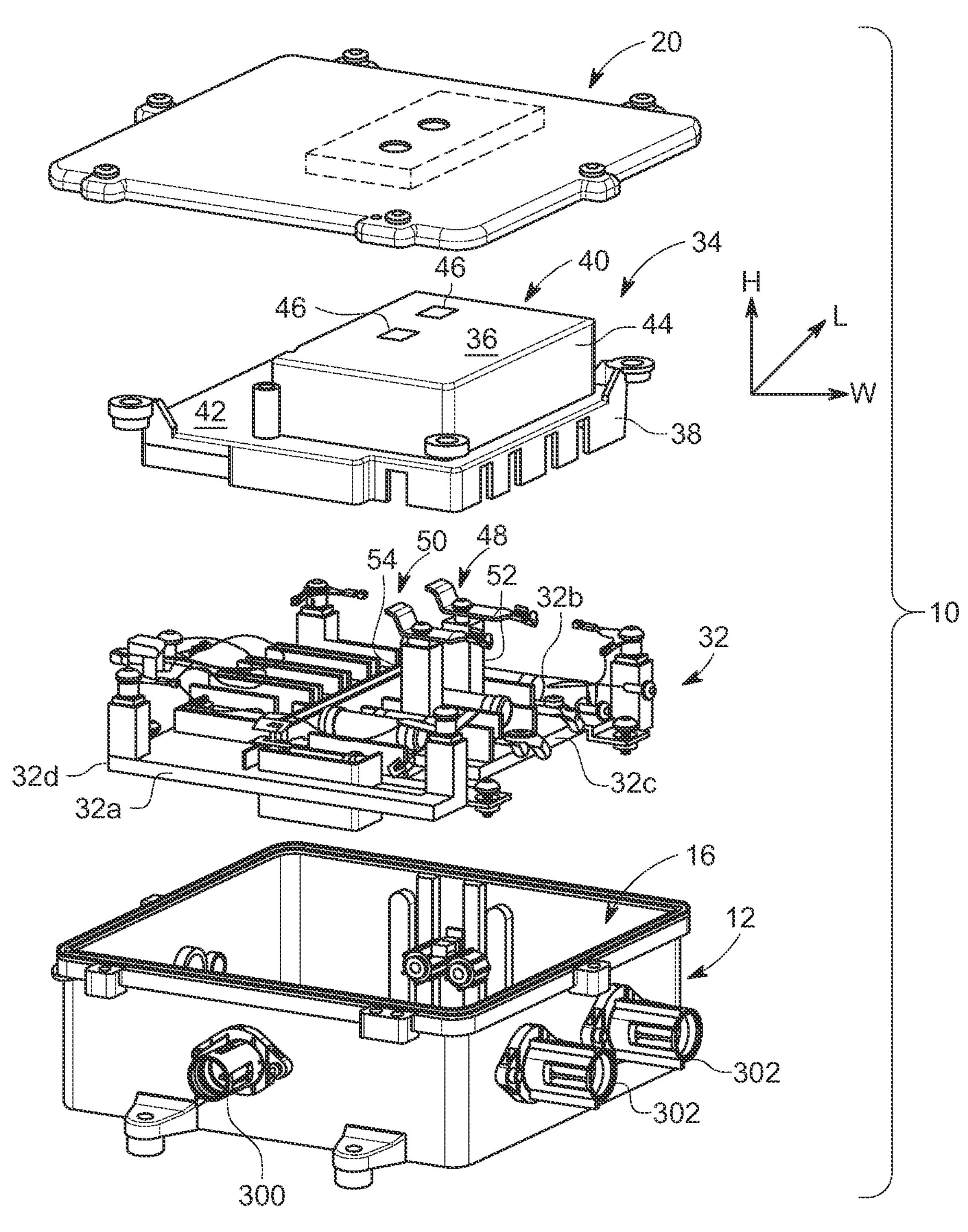
FIG. 4 is an exploded view of the electric junction box assembly shown in FIG. 3.

In one aspect, the electrically conductive patch 24 is centered on the top cover 20. FIG. 3 shows an aspect where the top cover 20 includes a recess 26 and the electrically conductive patch 24 is a sheet of steel having a generally cuboidal dimension. The electrically conductive patch 24 is disposed beneath the recess 26, in which case the top surface 24*a* of the electrically conductive patch 24 is covered by a portion of the top cover 20 that is electrically insulating and the bottom surface of the electrically conductive patch 24 is exposed. FIGS. 3 and 4 show the electrically conductive patch 24 in broken lines to indicate that the electrically conductive patch 24 is hidden by the top cover 20. Alternatively, the top cover 20 may include an opening for which the electrically conductive patch 24 is seated within, in which case the top surface 24*a* and the bottom surface are exposed. It should be appreciated that the electrically conductive patch 24 may be fixed to the top cover 20 using a conventional fixing means such as an adhesive, a screw or the top cover 20 may be configured with a groove in which the edges of the electrically conductive patch 24 is inserted.

The top cover 20 may be a generally planar member having a lip portion 28. For instance, the top cover 20 may include a main body portion 30 that bounds the electrically conductive patch 24 and the lip portion 28 bounds the periphery of the main body portion 30 so as to cover the periphery of the open top 16. The main body portion 64 30 may be formed of an electrically insulating material and the electrically conductive patch 24 may be elevated relative to the main body portion 30.

With reference now to FIGS. 4-7, the electric junction box assembly 10 further includes an inner case 32 disposed within the outer case 12. The inner case 32 may be formed of a resilient and durable material suitable for injection molding, illustratively including polypropylene, Acrylonitrile butadiene styrene, polyoxymethylene, polycarbonate and the like. The electric junction box assembly 10 further includes an upper cover 34 configured to cover the inner case 32. The inner case 32 includes a front portion 32*a* opposite a back portion 32*b* and a pair of side portions 32*c*, 32*d* connected to each other to define a generally cuboidal base for which structure may be mounted onto to support electric components for regulating power is disposed within the inner case 32, such as a printed circuit board with resistors, fuses and the like.

The upper cover 34 is configured to protect the electronic components mounted to the inner case 32. The upper cover 34 is a generally planar and resilient member that is not electrically conductive and formed of a material suitable for injection molding, illustratively including polypropylene, Acrylonitrile butadiene styrene, polyoxymethylene, polycarbonate and the like. The upper cover 34 includes a top wall member 36 and a lip 38 bounding the periphery of the upper cover 34. In one aspect, the top wall member 36 includes a raised housing 40 and the upper cover 34 further includes a base portion 42 wherein the raised housing 40 of the top wall member 36 is elevated relative to the base portion 42. Both the raised housing 40 and the base portion 42 are generally planar members having a smooth and continuous surface and are generally parallel to each other. The top wall member 36 may include an upper wall 44 which bounds the raised housing 40. A bottom edge of the upper wall 44 is attached to or integrally formed with the base portion 42 of the upper cover 34. The raised housing 40 is disposed along a plane defined by a width "W" and a length "L" of the electric junction box assembly 10. The raised housing 40 includes a pair of slits 46 that are spaced apart from each other and disposed beneath the electrically conductive patch 24 of the top cover 20. The slits 46 extend through the raised housing 40 of the upper cover 34 and are configured to provide access to the electrically conductive patch 24. In one aspect, the slits 46 are rectangular and dimensioned the same as each other.

Figure 5:
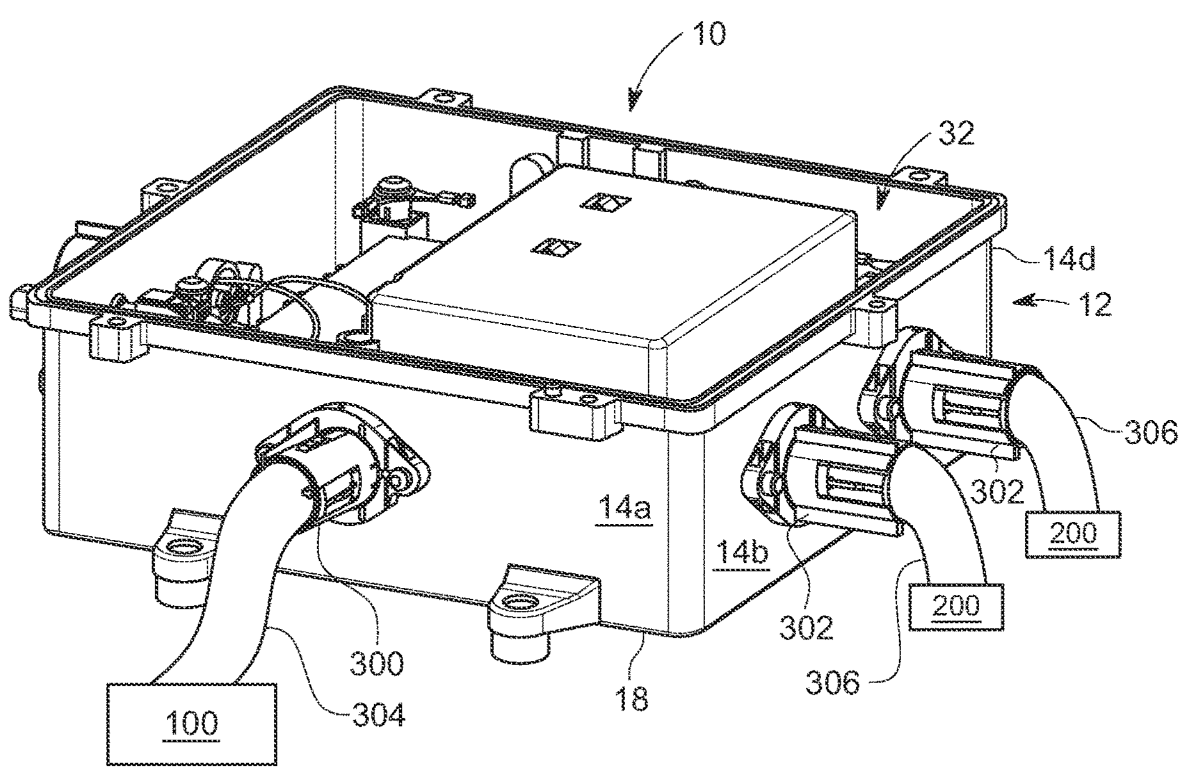
FIG. 5 is a perspective view of the inner case shown in FIG. 4 taken from the top.

With reference now to FIG. 5, an illustration of the electric junction box assembly 10 showing the top cover 20 removed is provided. The inner case 32 houses electronic components (not shown) configured to distribute power from the battery 100 to the electric devices 200. In particular, the inner case 32 houses components configured to place the first power terminal 300, disposed on the exterior of the outer case 12 and connected to the battery 100, in electrical connection with the second power terminal 302 disposed on the exterior of the outer case 12 and coupled to the second wire 306 which is connected to the electric devices 200. The inner case 32 includes a first terminal 48 and a second terminal 50 configured to be electrically connected to each other when the top cover 20 is mounted onto the outer case 12.

With reference again to FIG. 4, the inner case 32 may include a first tower 52 and a second tower 54 that are disposed in the inner case 32 and are spaced apart from each other. The first tower 52 and the second tower 54 may be molded into the inner case 32 or may be attached to the inner case 32. The first tower 52 and the second tower 54 may be dimensioned the same as each other and are generally elongated members having an upper surface for receiving the first terminal 48 and the second terminal 50. Both the first tower 52 and the second tower 54 includes a fastening bore 56 which may be threaded and configured to receive a first fastener 58, such as a bolt or a screw. The first tower 52 and the second tower 54 may be the same height and may be rectangular column defined by four (4) planar surfaces defining the exterior of the respective first and second towers 52, 54.

Figure 7:
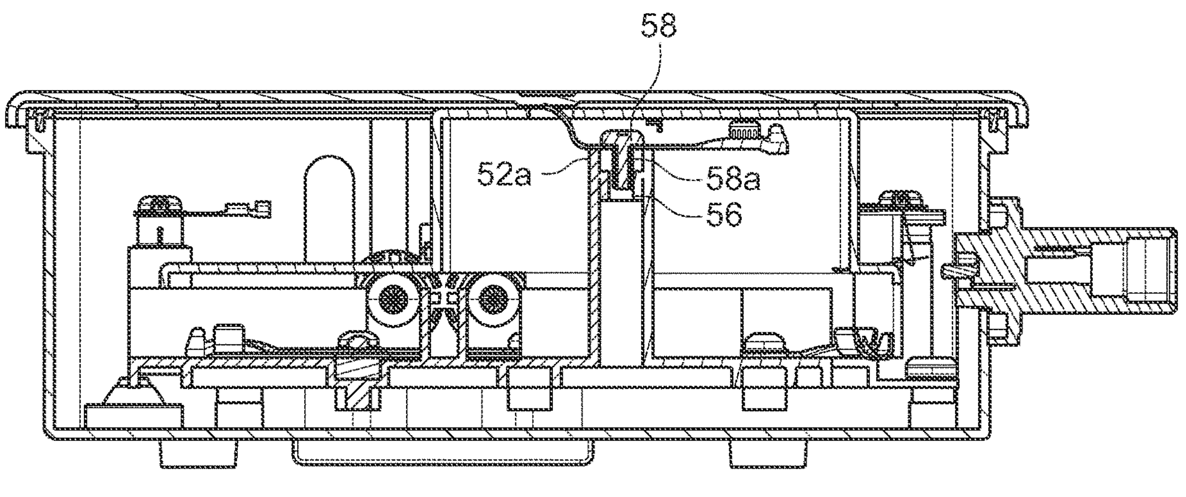
FIG. 7 is a cross-sectional view of FIG. 3 taken along line 7-7.
Figure 8:
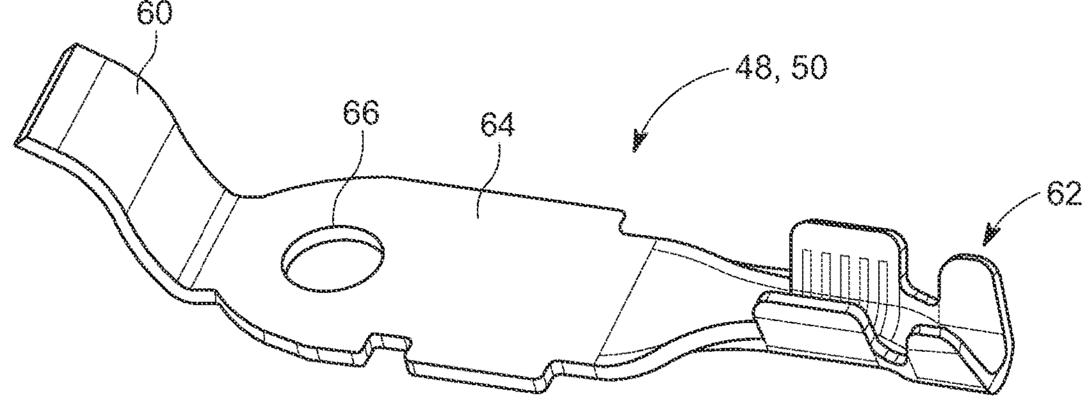
FIG. 8 is a perspective view of a terminal shown in FIG. 7.

With reference now to FIG. 8, the first terminal 48 and the second terminal 50 are electrically conductive members that complete an electric circuit when electrically connected to each other. The first and second terminals 48, 50, may be the same shape and dimension and thus a depiction of one is sufficient to describe the other. Each of the first and second terminals 48, 50 includes a projection portion 60 which project upwardly from a corresponding first and second towers 52, 54 towards the top cover 20. The projection portion 60 has a length greater than a distance from the bottom surface of the electrically conductive patch 24 and an upper surface 52*a*, 54*a* of the first and/or second towers 52, 54 taken along an axis orthogonal to the upper surface 52*a*, 54*a* of the first and/or second towers 52, 54 (as shown in FIG. 7). The projection portions 60 are formed of an electrically conductive and resilient material such as steel so as to bend when pressed.

In one aspect, the first and second terminals 48, 50 further include a clamp portion 62 and a body portion 64 interposed between the clamp portion 62 and the projection portion 60. The clamp portion 62 is configured to clamp onto a third wire. The clamp portion 62 may include a plurality of finger portions which may be bent around a wire to secure the wire and form an electric connection with the wire. The body portion 64 is configured to attach to the first tower 52 and the second tower 54 as the case may be. The body portion 64 includes a first aperture 66. The body portion 64 is a generally planar member and the first aperture 66 may be centered along a width of the body portion 64. Each of the first and second terminals 48, 50, is registered to a fastening bore 56 of a corresponding first and second towers 52, 54, and the first fastener 58 is inserted through the respective first aperture 66 into a corresponding fastening bore 56 so as to secure the first and second terminals 48, 50, to the corresponding first and second towers 52, 54. Preferably, the first fastener 58 includes a shaft portion **58*a* which may be threaded and a head portion 58*b* disposed on a proximal end of the shaft portion 58*a*. The shaft portion 58*a* is dimensioned to engage the threads of a fastening bore 56 of corresponding first and second towers 52, 54, and the head portion 58*b* has a diameter greater than a diameter of the first aperture of the first and second terminals 48, 50**.

Figure 6:
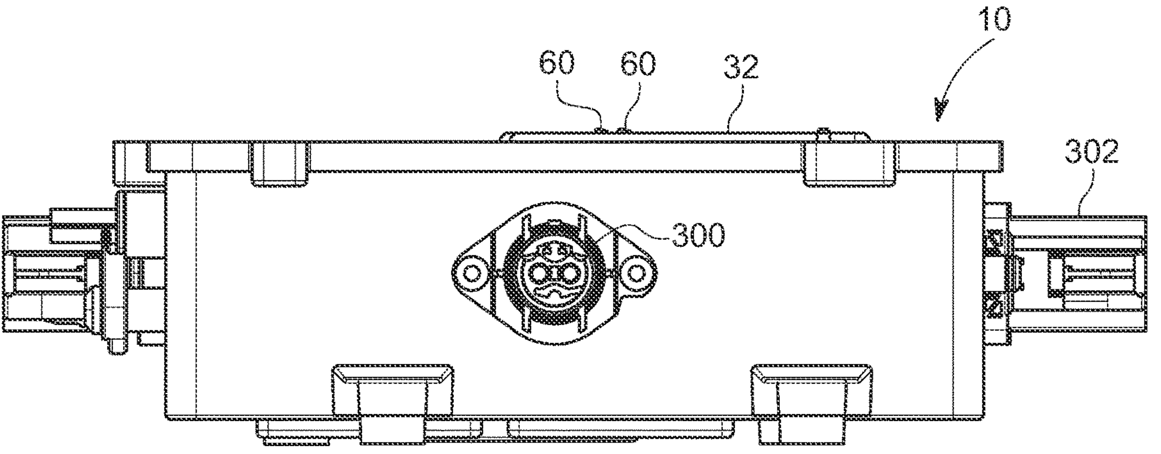
FIG. 6 is side view of FIG. 5.

The first terminal 48 and the second terminal 50 may be fixed to the first tower 52 and second tower 54, respectively, in such a manner where the projection portion 60 of the first terminal 48 points towards the projection portion 60 of the second terminal 50. Alternatively, the first terminal 48 and the second terminal 50 may be fixed to the first tower 52 and second tower 54, respectively, in such a manner where the projection portion 60 of the first terminal 48 points away from the projection portion 60 of the second terminal 50. In any aspect, the slits 46 are positioned to receive a distal end of the projection portions 60 of the first and second terminals 48, 50 (as shown in FIG. 6). Thus, in instances where the projection portions 60 point away from each other, the slits 46 are further apart from each other relative to an instance where the projection portions 60 are pointed towards each other.

In one aspect, the wire clamped onto the first terminal 48 is connected to the power source by a bus bar (not shown) and the wire of the second terminal 50 is connected to the second power terminal 302 so as to supply power to the electrical devices external to the electric junction box assembly 10. Accordingly, by electrically connecting the first terminal 48 and the second terminal 50 to the electrically conductive patch 24, power from the power source (e.g. battery 100) may be distributed to the electrical devices 200 external to the electric junction box assembly 10. Conversely, should the first terminal 48 and the second terminal 50 be disconnected from the electrically conductive patch 24, power to the electric junction box assembly 10 is interrupted.

With reference now to FIGS. 9 and 10, a cross-sectional view of the electric junction box assembly 10 is provided. The upper surface **52*a*, 54*a* of the first tower 52 and the second tower 54 are spaced apart from an inner surface 34*a* of the upper cover 34 so as to define a gap. The gap is sufficient to receive the head portion 58*b* of a respective first fastener 58 and keep the head portion 58*b* spaced apart and free from the upper cover 34**.

A difference in distance between an upper surface **52*a*, 54*a* of the first tower 52 and the second tower 54 and the inner surface 34*a* of the upper cover 34 is less than the height of the projection portions 60 of the first and second terminals 48, 50 so as to place the projection portions 60 into contact with the electrically conductive patch 24. In particular, each of the projection portions 60 are registered to be inserted into a corresponding slit 46 of the upper cover 34 and protrude from an outer surface 34*b* of the upper cover 34 when the upper cover 34 is attached to the inner case 32. Further, the top cover 20 is dimensioned to place a bottom surface 24*b* of the electrically conductive patch 24 in contact with the outer surface 34*b* of the upper cover 34 when the top cover 20 is attached to the outer case 12. Further, the electrically conductive patch 24 is dimensioned to cover the slits 46 disposed on the upper cover 34, accordingly the projection portions 60 are placed into contact with the electrically conductive patch 24**.

With reference again to FIGS. 3, and 4, the top cover 20 may be secure to the outer case 12 by conventional fastening mechanisms. For instance, the top cover 20 may be configured with at least one bolt hole 68 and the outer case 12 may be configured with at least one bore 70 for receiving a second fastener 72 to secure the top cover 20 to the outer case 12. In the current embodiment, the top cover 20 includes four (4) bolt holes 68 and the outer case 12 includes four bores 70, each configured to receive a second fastener 72 to secure the top cover 20 to the outer case 12. When the top cover 20 is secured, the bottom surface **20*b* of the top cover 20 contacts the outer surface 34*b* of the upper cover 34 and in doing so, the electrically conductive patch 24 is placed into contact with the projection portions 60 of the first and second terminals 48, 50 so as to complete an electric connection, as shown in FIG. 9**.

In operation, the electric junction box assembly 10 may be installed in an automotive vehicle (not shown) wherein a first wire 304 couples the battery 100 to the first power terminal 300 of the electric junction box assembly 10 and a second wire 306 is connected to a plurality of electric devices. When assembled, the top cover 20 is configured to press the electrically conductive patch 24 into electrical contact with the projection portions 60 of the first and second terminals 48, 50. Accordingly, the electrically conductive patch 24 and the projection portions 60 form an electric connection between the first terminal 48 and the second terminal 50 when the top cover 20 is mounted onto the outer case 12.

If maintenance is desired, the top cover 20 is simply removed which displaces the electrically conductive patch 24 from the projection portions 60 of the first and second terminals 48, 50, thereby disconnecting power. Accordingly, the electric junction box assembly 10 disclosed herein allows power to be disconnected by simply removing the top cover 20 so as to allow for maintenance to be performed.

While particular embodiments have been illustrated and described herein, it should be appreciated and understood that various other changes and modifications may be made without departing from the spirit and scope of the claim subject matter. Moreover, although various aspects of the claim subject matter have been described herein, such aspects need not be utilized in combination. It is therefore intended that the appended claims cover all such changes and modifications that are within the scope of the claim subject matter.

The invention claimed is:

1. An electric junction box assembly for distributing power from a battery to a plurality of electric devices, the electric junction box assembly comprising:

an outer case having an open top;

a top cover configured to close the open top, the top cover including an electrically conductive patch;

an inner case disposed in the outer case, the inner case including an open top and an upper cover configured to close the open top, the upper cover including a pair of slits spaced apart from each other and disposed beneath the electrically conductive patch;

a first terminal and a second terminal disposed in the inner case and spaced part from each other, both of the first terminal and the second terminal having a projection portion extending into a corresponding one of the pair of slits and contacting the electrically conductive path so as to complete an electric connection, wherein the electric connection is disconnected by removing the top cover; and a first tower spaced apart from a second tower, the first tower and the second tower are disposed in the inner case, wherein the first terminal is mounted on the first tower and the second terminal is mounted on the second tower, wherein the first terminal and the second terminal further includes a body portion and a clamp portion, the body portion interposed between the projection portion and the clamp portion.

2. The electric junction box assembly as set forth in claim 1, wherein the first tower and the second tower are a same height.

3. The electric junction box assembly as set forth in claim 1, wherein the electrically conductive patch is centered on the top cover.

4. The electric junction box assembly as set forth in claim 1, wherein the top cover includes a main body portion bounding the electrically conductive patch.

5. The electric junction box assembly as set forth in claim 4, wherein the main body portion is formed of an electrically insulating material.

6. The electric junction box assembly as set forth in claim 5, wherein the electrically conductive path is elevated relative to the main body portion.

7. The electric junction box assembly as set forth in claim 6, wherein the main body portion having a planar surface.

8. The electric junction box assembly as set forth in claim 1, wherein the clamp portion includes a plurality of fingers configured to clamp onto a wire.

9. The electric junction box assembly as set forth in claim 8, wherein the body portion includes an aperture for attachment to the one of the first tower and the second tower.

10. The electric junction box assembly as set forth in claim 9, wherein both the first tower and the second tower includes a threaded bore.

11. The electric junction box assembly as set forth in claim 10, further including a pair of fasteners having a threaded shaft and a head portion, the pair of fasteners fixing the first terminal and the second terminal to the pair of towers.

12. The electric junction box assembly as set forth in claim 11, wherein the projection portion of the first terminal and the projection portion of the second terminal are pointed towards each other.

13. The electric junction box assembly as set forth in claim 11, wherein the projection portion of the first terminal and the projection portion of the second terminal are pointed away from each other.

* * * * *